US012787711B2

(12) United States Patent
Takahashi et al.

(10) Patent No.: US 12,787,711 B2
(45) Date of Patent: Nov. 3, 2026

(54) SUBSTRATE HOLDER AND METHOD OF PRODUCING SUBSTRATE HOLDER

(71) Applicant: NGK SPARK PLUG CO., LTD., Nagoya (JP)

(72) Inventors: Kazuya Takahashi, Nagoya (JP); Naotoshi Morita, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 850 days.

(21) Appl. No.: 18/065,784

(22) Filed: Dec. 14, 2022

(65) Prior Publication Data

US 2023/0187263 A1 Jun. 15, 2023

(30) Foreign Application Priority Data

Dec. 14, 2021 (JP) ................................ 2021-202451
Nov. 10, 2022 (JP) ................................ 2022-180448

(51) Int. Cl.
*H10P 72/76* (2026.01)
*H05B 3/14* (2006.01)
(Continued)

(52) U.S. Cl.
CPC ......... *H10P 72/7624* (2026.01); *H05B 3/143* (2013.01); *H05B 3/283* (2013.01); *H10P 72/0432* (2026.01); *H10P 72/7616* (2026.01)

(58) Field of Classification Search
CPC ........... H01L 21/67103; H01L 21/6831; H01L 21/68757; H01L 21/68785;
(Continued)

(56) References Cited

U.S. PATENT DOCUMENTS

2002/0112820 A1* 8/2002 Yamaguchi ....... H01L 21/68757 118/728
2004/0188413 A1* 9/2004 Natsuhara ......... H01L 21/67109 219/466.1
(Continued)

FOREIGN PATENT DOCUMENTS

JP 2015-191837 * 11/2015
JP 2015-191837 A 11/2015
(Continued)

OTHER PUBLICATIONS

Korean Intellectual Property Office, Office Action (Request for the Submission of an Opinion) issued in corresponding Application No. 10-2022-0174011 dispatched Mar. 10, 2026.
(Continued)

*Primary Examiner* — Sang Y Paik
(74) *Attorney, Agent, or Firm* — Stites & Harbison PLLC; Jeffrey A. Haeberlin

(57) ABSTRACT

There is provided a substrate holder including: a ceramic base member; electrodes embedded in the ceramic base member; at least one conductive member embedded in the ceramic base member; connecting parts each of which has an end electrically connected to one of the electrodes; a land electrically connected to the at least one conductive member; and terminals each of which has an end connected to one of the electrodes, the at least one conductive member or the land. A resistance value between a connecting part, included in the connecting parts and connected to the at least one conductive member, and a terminal, included in the terminals and connected to the at least one conductive member is smaller than a resistance value between both ends of each of the electrodes; and the number of the terminals is smaller than two times the number of the electrodes.

7 Claims, 10 Drawing Sheets

(51) Int. Cl.

| | |
|---|---|
| ***H05B 3/28*** | (2006.01) |
| ***H10P 72/00*** | (2026.01) |

(58) Field of Classification Search

CPC .. H05B 2203/016; H05B 3/143; H05B 3/283; H10P 72/0432; H10P 72/72; H10P 72/7616; H10P 72/7624

USPC ........................................................ 219/444.1

See application file for complete search history.

(56) References Cited

U.S. PATENT DOCUMENTS

| | | | | |
|---|---|---|---|---|
| 2011/0062144 | A1* | 3/2011 | Akatsuka | H05B 3/143 219/532 |
| 2019/0346838 | A1* | 11/2019 | Leeser | C23C 16/4586 |
| 2022/0157636 | A1* | 5/2022 | Takemoto | H10P 72/722 |

FOREIGN PATENT DOCUMENTS

| | | | |
|---|---|---|---|
| JP | 2018-5999 | A | 1/2018 |
| JP | 2020-191315 | A | 11/2020 |

OTHER PUBLICATIONS

Taiwan Patent Office, Office Action (Notification for the Opinion of Examination) issued in corresponding Application No. 111147728 dated Jan. 30, 2026.

* cited by examiner

SUBSTRATE HOLDER AND METHOD OF PRODUCING SUBSTRATE HOLDER

REFERENCE TO RELATED APPLICATIONS

This application claims priorities from Japanese Patent Application No. 2021-202451 filed on Dec. 14, 2021 and Japanese Patent Application No. 2022-180448 filed on Nov. 10, 2022. The entire contents of the priority applications are incorporated herein by reference.

BACKGROUND ART

Technical Field

The present disclosure relates to a substrate holder which is configured to hold a substrate such as a silicon wafer, etc., and a method of producing the substrate holder.

Background Art

As an example of a substrate holder which is configured to hold a substrate such as a wafer, etc., there is known a ceramic heater in which two heat elements (heating resistors) corresponding, respectively, two different heating areas are embedded or buried.

DESCRIPTION

Problem to be Solved by the Invention

In the known ceramic heater described above, two terminals are connected to each of the two heating resistors so as to supply the electric power to the two heating resistors. Accordingly, the terminals of which number (quantity) is two times the number of the heating resistor are required.

The present disclosure has been made in view of the above-described circumstances; an object of the present disclosure is to provide, in a substrate holder in which a plurality of electrodes is embedded or buried, a technique for reducing the number of terminals configured to supply the electric power to each of the electrodes.

SUMMARY

According to an aspect of the present disclosure, there is provided a substrate holder including: a ceramic base member having an upper surface and a lower surface facing the upper surface in an up-down direction; a plurality of electrodes embedded in the ceramic base member; at least one conductive member embedded in the ceramic base member; a plurality of connecting parts each of which has an end electrically connected to one of the plurality of electrodes; a land electrically connected to the at least one conductive member; and a plurality of terminals each of which has an end connected to one of the land, the at least one conductive member or one of the plurality of electrodes. A resistance value between a connecting part, of the plurality of connecting parts, connected to the at least one conductive member, and a terminal, of the plurality of terminals, connected to the at least one conductive member is smaller than a resistance value between both ends of each of the plurality of electrodes. The number of the plurality of terminals is smaller than two times the number of the plurality of electrodes. The land overlaps with one of the plurality of terminals in the up-down direction, at a first position in a horizontal plane which is orthogonal to the up-down direction. The land overlaps, at a second position different from the first position in the horizontal plane, with one of the plurality of connecting parts and one of the plurality of electrodes in the up-down direction, or overlaps, at the second position, with the at least one conductive member in the up-down direction.

In the above-described aspect, the number of the plurality of terminals is smaller than two times the number of the plurality of electrodes. With this, it is possible to make a space in which the plurality of terminals is arranged be small. Further, the resistance value between the connecting part of the plurality of connecting parts which is connected to the at least one conductive member and the terminal of the plurality of terminals which is connected to the at least one conductive member is smaller than the resistance value between both ends of each of the plurality of electrodes. With this, even in a case that an electrode of the plurality of electrodes and a terminal of the plurality of terminals are connected via the at least one conductive member and a connecting part of the plurality of connecting parts, it is possible to suppress the generation of heat in the at least one conductive member. Furthermore, by providing the land, it is possible to reduce the resistance in a part in which the land is provided, thereby making it possible to suppress the generation of heat particularly at the part on which the land is provided and at a location between the land and the connecting part.

DESCRIPTION OF THE EMBODIMENT

Figure 1:
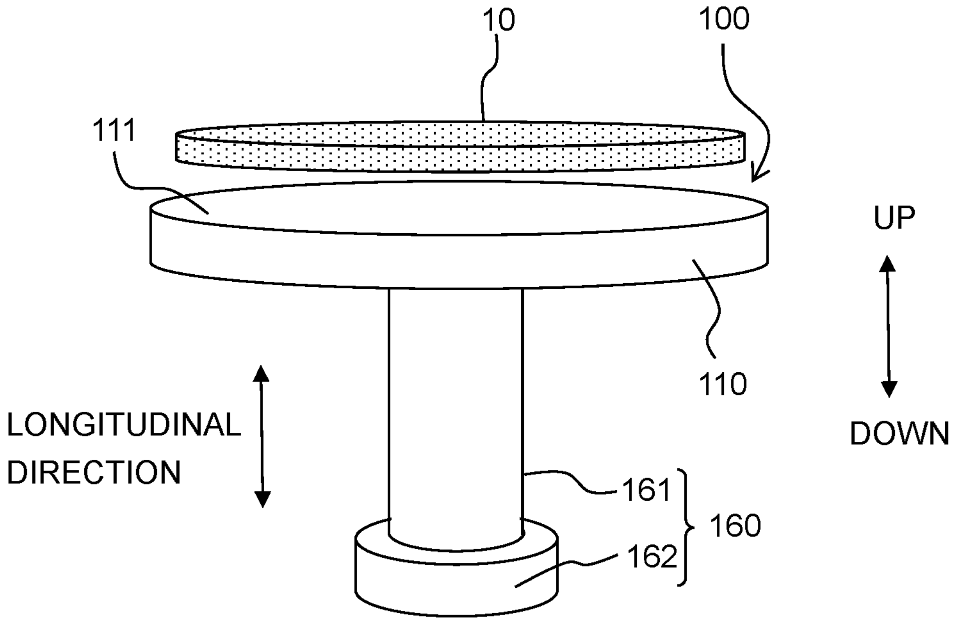
FIG. 1 is a perspective view of a substrate holder 100.
Figure 2:
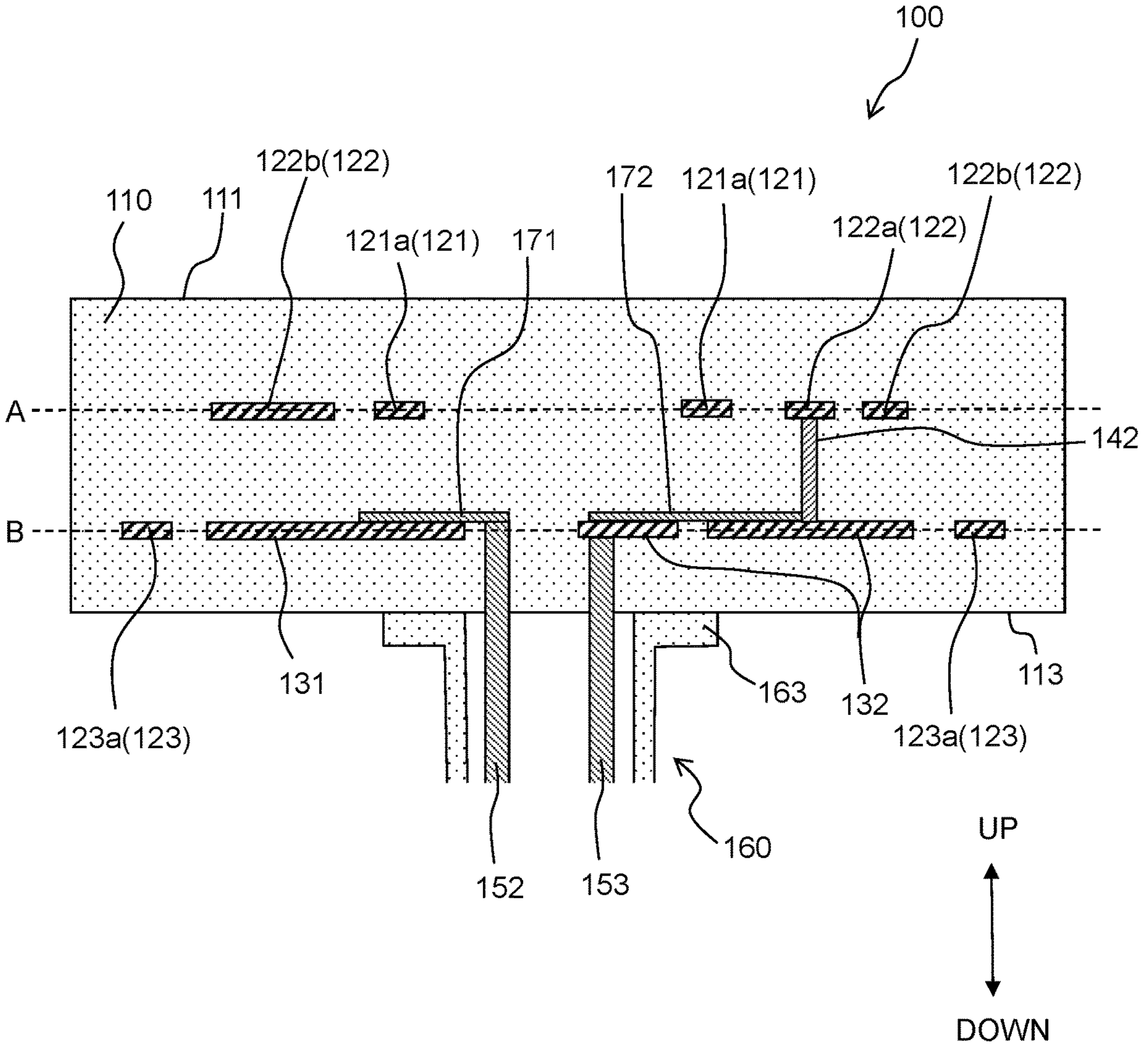
FIG. 2 is a view schematically depicting a vertical cross section of a ceramic base member 110.
Figure 3A:
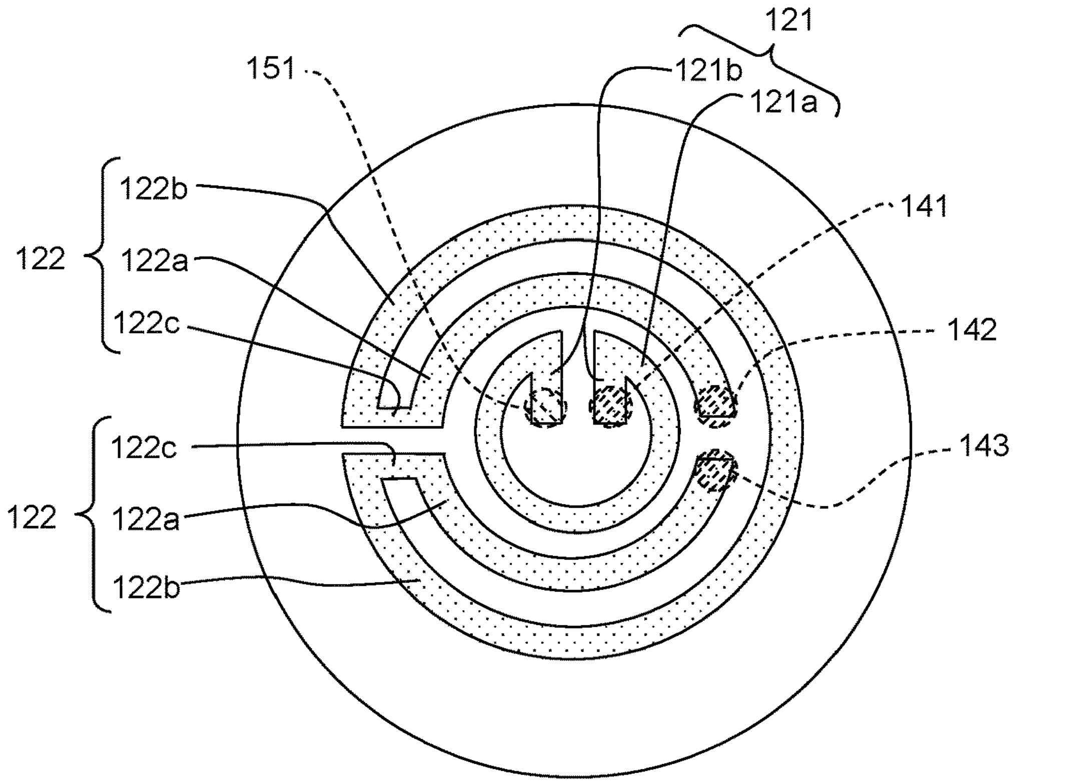
FIG. 3A is a view schematically depicting a cross section of the ceramic base member 110 in a virtual plane A depicted in FIG. 2.
Figure 3B:
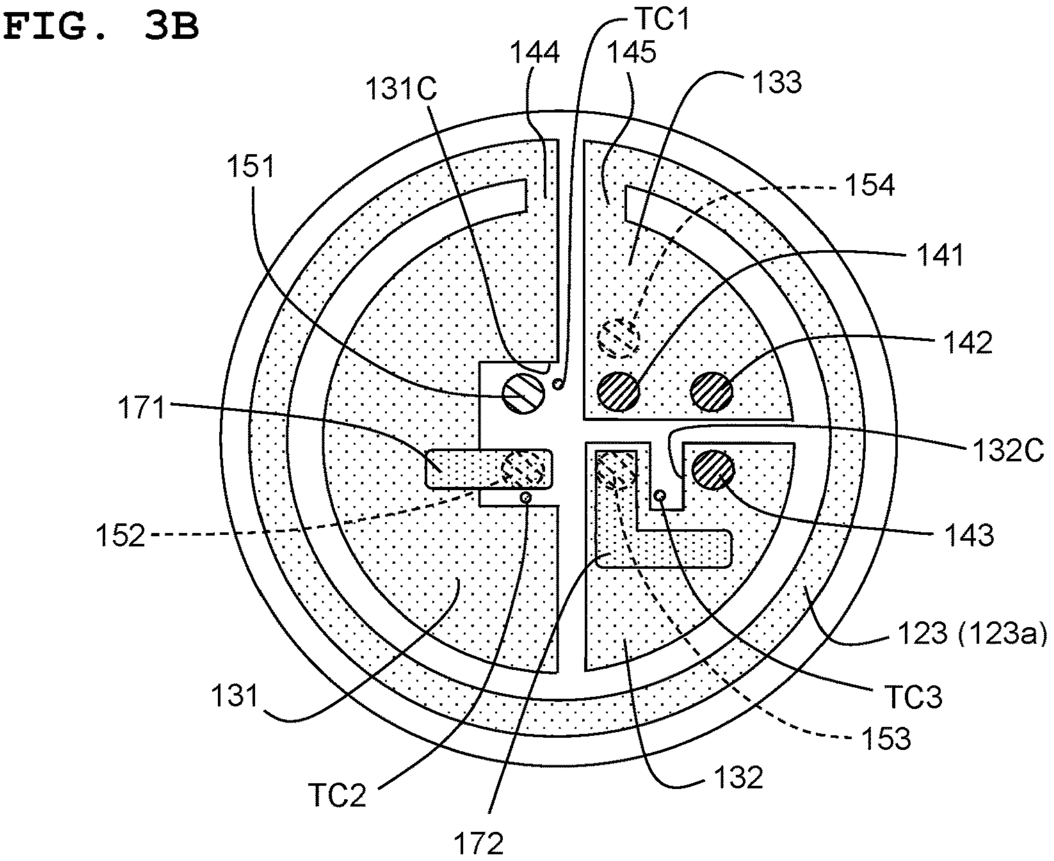
FIG. 3B is a view schematically depicting a cross section of the ceramic base member 110 in a virtual plane B depicted in FIG. 2.

A substrate holder 100 according to an embodiment of the present disclosure will be explained, with reference to FIGS. 1 and 2. The substrate holder 100 according to the present embodiment is a ceramic heater used for heating a semiconductor wafer (herein after referred as to a "wafer 10") such as a silicon wafer, etc. Note that in the following explanation, an up-down direction is defined, with a state that the substrate holder 100 is installed usably (a state depicted in FIG. 1) as the reference. As depicted in FIG. 1, the substrate holder 100 according to the present embodiment is provided with a ceramic base member 110 and a shaft 160. Further, as depicted in FIGS. 2, 3A and 3B, electrodes 121 to 123, conductive members 131 to 133, connecting parts 141 to 145, terminals 151 to 154 and lands 171 and 172 are embedded in the ceramic base member 110. Furthermore, as depicted in FIG. 3B, passages via which temperature sensors TC1 to TC3 such as thermocouples, etc., are arranged in respective locations in the substrate holder 100 are provided, respectively, in the vicinities of the terminals 151 to 153.

<Ceramic Base Member 110>

The ceramic base member 110 is a member having a shape of a circular plate of which diameter is 12 inches (approximately 300 mm) and of which thickness is 25 mm. As depicted in FIG. 1, a wafer 10 as an object of heating is placed on an upper surface 111 of the ceramic base member 110. Note that in FIG. 1, the wafer 10 and the ceramic base member 110 are illustrated to be separated from each other such that the drawing is easily viewed. The ceramic base member 110 can be formed, for example, of a ceramic sintered body of aluminum nitride, silicon carbide, alumina, silicon nitride, etc.

FIG. 2 is a view schematically depicting a vertical cross section of the ceramic base member 110. Virtual planes A and B indicated in broken lines in FIG. 2 are each a horizontal plane orthogonal to the up-down direction. The virtual planes A and B are between the upper surface 111 and a lower surface 113 of the ceramic base member 110 in the up-down direction; the virtual plane A is positioned above the virtual plane B. FIG. 3A is a view schematically depicting a cross section of the ceramic base member 110 in the virtual plane A, and FIG. 3B is a view schematically depicting a cross section of the ceramic base member 110 in the virtual plane B. As depicted in FIGS. 2, 3A and 3B, the three electrodes 121 to 123, the three conductive parts 131 to 133, the five connecting parts 141 to 145, the four terminals 151 to 154 and the two lands 171 and 172 are embedded in the inside of the ceramic base member 110.

<Electrodes 121 to 123>

An explanation will be given about the electrodes 121 to 123, with reference to FIGS. 2, 3A and 3B. The electrodes 121 to 123 are each formed by cutting, in a shape of a belt or band, a heat resisting metal (a high melting point metal of which melting point is not less than 2000° C.) such as, for example, a foil including tungsten (W), molybdenum (Mo) or an alloy including the molybdenum and/or the tungsten; or a mesh which is obtained by weaving a wire including tungsten (W), molybdenum (Mo) or an alloy including the molybdenum and/or the tungsten; etc. In a case that each of the electrodes 121 to 123 is used as a heater electrode, it is preferred that the mesh is used so as to secure the resistance value. It is preferred that the resistance value of each of the electrodes 121 to 123 is in a range of approximately 2Ω to approximately 20Ω. Each of the electrodes 121 to 123 can be formed, for example, by cutting a material made of Mo mesh (wire diameter: 0.1 mm; plain woven #50 mesh) into a predetermined pattern. It is preferred that the purity of each of the tungsten and the molybdenum is not less than 99%. It is preferred that the thickness of each of the electrodes 121 to 123 is in a range of 0.03 mm to 0.2 mm, except for a part of an intersection point of the wire. Further, the width of each of the electrodes 121 to 123 which has been cut in the shape of the band is preferably in a range of 2.5 mm to 20 mm, and more preferably in a range of 5 mm to 15 mm. In the present embodiment, although each of the electrodes 121 to 123 is cut in a shape as depicted in FIGS. 3A and 3B, the shape of each of the electrodes 121 to 123 is not limited to this, and may be changed as appropriate. Note that it is allowable that at least one of an electrostatic chuck electrode which is configured to attract the wafer 10 toward the upper surface 111 by the Coulomb force and a plasma electrode configured to generate a plasma at a location above the ceramic base member 110 is embedded in the inside of the ceramic base member 110, in addition to the electrodes 121 to 123.

As depicted in FIG. 3A, the electrode 121 is arranged substantially at the center of the virtual plane A of the ceramic base member 110, and the electrode 122 is arranged so as to surround the outer side of the electrode 121. The electrode 121 has a ring part 121*a* having a substantially annular ring shape and two linear parts 121*b* extending linearly. The ring part 121*a* has an annular ring shape which is open at an upper side in FIG. 3A, and the two linear parts 121*b* extend, respectively, from both ends of the ring part 121*a* which has the opened annular ring shape, toward a lower side of FIG. 3A. The electrode 122 has two inner side ring parts 122*a* which have a semi-circular annular ring shape and which are arranged so as to surround the outer side of the ring part 121*a* of the electrode 121, an outer side ring part 122*b* which has a substantially annular ring shape and which is arranged so as to surround the outer side of the two inner side ring parts 122*a*, and two linear parts 122*c* which extend linearly so as to link or connect the two inner side ring parts 122*a* and the outer side ring part 122*b*. The outer side ring part 122*b* has an annular ring shape of which left side in FIG. 3A is opened. The two linear parts 122*c* extend in the left-right direction of FIG. 3A so as to join the both ends of the outer side ring parts 122*b* and the two inner side ring parts 122*a*, respectively.

As depicted in FIG. 3B, the electrode 123 is arranged on an outer circumferential part of the virtual plane B of the ceramic base member 110. The electrode 123 includes a ring part 123*a* having a substantially annular ring shape of which upper side in FIG. 3B is opened. In a case that the virtual plane A and the virtual plane B are overlapped, the electrode 123 is arranged at the outside of the electrode 121 and the electrode 122, and the electrode 121, the electrode 122 and the electrode 123 are arranged coaxially such that the electrodes 121, 122 and 123 do not overlap with one another. Namely, the outer diameter of the electrode 123 is greater than the outer diameter of each of the electrodes 121 and 122. With this, the upper surface 111 of the ceramic base member 110 is divided or grouped into three zones corresponding, respectively, to the electrode 121, the electrode 122 and the electrode 123 (a zone overlapping with the electrode 121, a zone overlapping with the electrode 122 and a zone overlapping with the electrode 123 in the up-down direction).

<Conductive Members 131 to 133>

Next, the conductive members 131 to 133 will be explained, with reference to FIGS. 2, 3A and 3B. As depicted in FIG. 3B, the conductive members 131 to 133 are arranged in the same virtual plane B. The conductive members 131 to 133 are arranged so as to occupy an area having a substantially circular shape on the inside of the electrode 123, and so as not to overlap with one another. The conductive member 131 has a substantially semi-circular shape, and occupies substantially a left half of the area inside the electrode 123. A cutout 131C having a rectangular shape is formed in the conductive part 131, at a part thereof in a substantially central part on the right side of the conductive member 131. The conductive member 132 has a shape of a fan of which center angle is approximately 90 degrees, and is arranged on the right side with respect to the conductive member 131 so as to face the lower half of the conductive member 131. A cutout 132C having a rectangular shape is formed in the conductive member 132 at a substantially central part on the upper side of the conductive member 132. The conductive member 133 has a shape of a fan of which center angle is approximately 90 degrees, and is arranged on the right side with respect to the conductive member 131 so as to face the upper half of the conductive member 131.

The total of the areas, respectively, of the conductive members 131 to 133 is preferably not less than 40%, and is more preferably not less than 55%, of an area of a virtual circle defined by the outer diameter of the electrode 123 of which outer diameter is the largest among the electrodes 121 to 123. Further, each of the area of the conductive member 131, the area of the conductive member 132 and the area of the conductive member 133 is preferably not less than 40%, and is more preferably not less than 55% of, an area obtained by dividing the area of the virtual circle by the number or quantity (which is 3 (three)) of the electrodes 121 to 123.

The conductive members 131 to 133 are each formed by cutting, in a predetermined shape, a heat resisting metal (a high melting point metal) such as, for example, a foil including tungsten (W), molybdenum (Mo) or an alloy including the molybdenum and/or the tungsten, or a mesh which is obtained by weaving a wire including tungsten (W), molybdenum (Mo) or an alloy including the molybdenum and/or the tungsten, etc., in a similar manner to the electrodes 121 to 123. Note that the conductive members 131 to 133 are preferably formed of a same metallic material as that of the electrodes 121 to 123. In this case, it is possible to perform the production easily and to suppress any distortion due to any difference in the shrinkage factor during the baking. As will be described later on, the conductive member 131 is connected to the connecting part 144 (see FIG. 3B). Further, the conductive member 131 is connected to the terminal 152 via the land 171. A resistance between the connecting part 144 and a part, of the conductive member 131, connected to the land 171 is approximately in a range of approximately 0.001Ω to approximately 1Ω, and is smaller than the resistance of each of the electrodes 121 to 123. The conductive member 132 is connected to the terminal 153 and the connecting part 143 (see FIG. 3B). A resistance between the connecting part 143 and a part, of the conductive member 132, connected to the terminal 153 is in a range of approximately 0.001Ω to approximately 1Ω, and is smaller than the resistance of each of the electrodes 121 to 123. Note, however, that in the present embodiment, the cutout 132C is formed in the conductive member 132 so as to secure a space, such as the passage via which a temperature sensor TC1 such as a thermocouple is arranged. With this, the resistance between the connecting part 143 and the part, of the conductive member 132, which is connected to the terminal 153 becomes slightly higher than that in a case in which the cutout 132C is not provided. The conductive member 133 is connected to the terminal 154 and the connecting parts 141, 142 and 145 (see FIG. 3B). A resistance between the connecting part 141 and a part, of the conductive member 133, connected to the terminal 154, the resistance between the connecting part 142 and the part, of the conductive member 133, connected to the terminal 154 and the resistance between the connecting part 145 and the part, of the conductive member 133, connected to the terminal 154 are each in a range of approximately 0.001Ω to approximately 1Ω, and is smaller than the resistance of each of the electrodes 121 to 123.

<Connecting Parts 141 to 145>

Next, the connecting parts 141 to 145 will be explained, with reference to FIGS. 2, 3A and 3B. As depicted in FIG. 2, the connecting parts 141 and 142 are arranged between the virtual plane A and the virtual plane B. A lower end of each of the connecting parts 141 and 142 is electrically connected to the conductive member 133. Note that in the following explanation, the term "electrically connected" is simply referred to as "connected". An upper end of the connecting part 141 is connected to the linear part 121*b* of the electrode 121, and an upper end of the connecting part 142 is connected to the ring part 122*a* of the electrode 122. The connecting part 143 is also arranged between the virtual plane A and the virtual plane B, similarly to the connecting parts 141 and 142 (see FIGS. 3A and 3B). A lower end of the connecting part 143 is connected to the conductive member 132, and an upper end of the connecting part 143 is connected to the ring part 122*a* of the electrode 122. These connecting parts 141 to 143 are a via structure connecting the virtual plane A and the virtual plane B. Further, as depicted in FIG. 3B, the connecting parts 144 and 145 are arranged in the virtual plane B. One end (an end part on the upper side of FIG. 3B) of each of the connecting parts 144 and 145 is connected to the electrode 123. The other end (an end part on the lower side of FIG. 3B) of the connecting part 144 is connected to the conductive member 131, and the other end (an end part on the lower side of FIG. 3B) of the connecting part 145 is connected to the conductive member 133. The connecting parts 144 and 145 are each formed of a same material as that of the plurality of electrodes 121 to 123 and the plurality of conductive member 131 to 133 (a foil including tungsten (W), molybdenum (Mo) or an alloy including the molybdenum and/or the tungsten, or a mesh which is obtained by weaving a wire including tungsten (W), molybdenum (Mo) or an alloy including the molybdenum and/or the tungsten, etc.). With this, the connecting part 144 is integrated with the conductive member 131 and the electrode 123, and the connecting part 145 is integrated with the conductive member 133 and the electrode 123.

<Terminals 151 to 154>

Next, an explanation will be given about the terminals 151 to 154, with reference to FIGS. 2, 3A and 3B. As depicted in FIG. 2, an upper end of the terminal 151 is connected to the linear part 121*b* (see FIG. 3A) of the electrode 121. The upper end of the electrode 121 may make contact with the linear part 121*b* of the electrode 121. Alternatively, the upper end of the terminal 151 and the linear part 121*b* of the electrode 121 may make contact with each other via a pellet formed of tungsten, molybdenum, or an alloy including at least one of the molybdenum and the tungsten. This is similarly applicable to the terminals 152 to 154 which will be described later on. The terminal 151 extends downwardly from the linear part 121*b* of the electrode 121 and further extends downwardly while passing a hollow part of a hollow cylindrical part 161 of a shaft 160 (to be descried later on). Note that as depicted in FIG. 3B, the rectangular-shaped cutout 131C is formed at a substantially central part which is on the right side of the conductive member 131 arranged in the virtual plane B. Since the terminal 151 extends downwardly while passing a part, of the virtual plane B, in which the cutout 131C is formed, the terminal 151 and the conductive member 131 is not electrically conducted.

As depicted in FIG. 2, an upper end of the terminal 154 is connected to the conductive member 133 arranged in the virtual plane B. The terminal 154 extends downwardly from the conductive member 133, and similarly to the terminal 151, extends downwardly while passing the hollow part of the cylindrical part 161 of the shaft 160. An upper end of the terminal 152 is connected to the land 171 arranged in the virtual plane B (see FIG. 3B). The terminal 152 extends downwardly from the land 171, and similarly to the terminal 151, extends downwardly while passing the hollow part of the cylindrical part 161 of the shaft 160. Note that similarly to the terminal 151, the terminal 152 extends downwardly while passing the part, in the virtual plane B, in which the cutout 131C is formed. Accordingly, the terminal 152 does not directly make contact with the conductive member 131. Further, an upper end of the terminal 153 is connected to the conductive member 132 arranged in the virtual plane B (see FIG. 3B). The terminal 153 extends downwardly from the conductive member 132, and similarly to the terminal 151, extends downwardly while passing the hollow part of the cylindrical part 161 of the shaft 160. In such a manner, the four terminals 151 to 154 are arranged in the hollow part of the cylindrical part 161 of the shaft 160. Note that the passages TC1 and TC2 are provided, on the area in which the cutout 131C is formed, respectively at locations in the vicinity of the terminals 151 and 152; the temperature sensor such as the thermocouple, etc., is arranged while passing each of the passages TC1 and TC2. Similarly, the passage TC3 is provided, on the area in which the cutout 132C is formed, at a location in the vicinity of the terminal 153; a temperature sensor such as the thermocouple, etc., is arranged while passing the passage TC3.

<Lands 171, 172>

As depicted in FIGS. 2 and 3B, the land 171 has an outer shape of a substantially rectangular plate. The land 171 extends in the left-right direction of FIG. 3B so as to cover the upper end of the terminal 152 and the conductive member 131 in the virtual plane B. In FIG. 3B, a left end of the land 171 is connected to the conductive member 131 and a right end of the land 171 is connected to an upper surface of the terminal 152. Note that as will be described later on, it is allowable that the land 171 and the terminal 152 are connected via a pellet formed of tungsten, molybdenum, or an alloy including at least one of the tungsten and molybdenum. The land 172 has an outer shape which is a substantially L-shaped plate. In the virtual plane B, the land 172 extends from a position at which the land 172 covers the upper end of the terminal 153 toward the lower side of FIG. 3B so as to avoid or circumvent the cutout 132C, and then extends rightward. In FIG. 3B, a position of a right end in the left-right direction of the land 172 is same as a position in the left-right direction of the connecting part 143.

The land 171 is provided so as to electrically connect the terminal 152 and the conductive member 131. As will be described later on, the land 172 is provided so as to lower the resistance between the terminal 153 and the connecting part 143. It is preferred that the lands 171 and 172 are each formed of a high melting point metal of which melting point is not less than 2000° C. In particular, it is preferred that the lands 171 and 172 are each formed of tungsten (W), molybdenum (Mo), or an alloy including the molybdenum and/or the tungsten. It is preferred that the width of each of the lands 171 and 172 is in a range of approximately 1 mm to approximately 10 mm, and that the thickness of each of the lands 171 and 172 is in a range of approximately 0.1 mm to approximately 4 mm. Note that although the land 171 has a linear shape, and the land 172 has a polygonal shape, it is not necessarily indispensable that the land 171 has the linear shape and that the land 172 has the polygonal shape; it is allowable that each of the lands 171 and 172 has a curved shape.

<Shaft 160>

Figure 4:
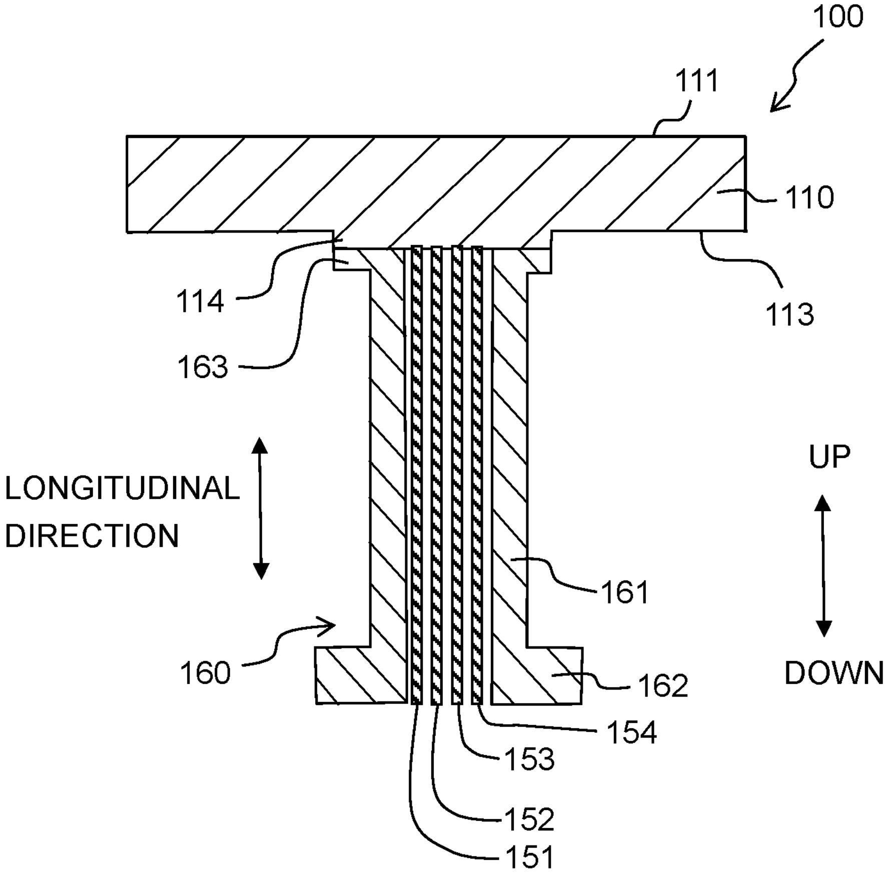
FIG. 4 is an explanatory view depicting a case that a joining projection 114 is provided on a lower surface 113 of the ceramic base member 110.

Next, an explanation will be given about the shaft 160, with reference to FIGS. 1, 2 and 4. As depicted in FIGS. 1, 2 and 4, the shaft 160 is connected to the lower surface 113 of the ceramic base member 110. The shaft 160 has a cylindrical part 161 which has a substantially hollow cylindrical shape, and a large diameter part 162 (see FIG. 1) which is provided at a location below the cylindrical part 161. The large diameter part 162 has a diameter greater than the diameter of the cylindrical part 161. In the following explanation, the longitudinal direction of the cylindrical part 161 is defined as a longitudinal direction of the shaft 160. As depicted in FIG. 1, in a usage state of the substrate holder 100 (a state that the substrate holder 100 is used), the longitudinal direction of the shaft 160 is parallel to the up-down direction.

As depicted in FIG. 2, a through hole extending in the longitudinal direction (see FIG. 1) is formed in the inside (an area on the inner side with respect to the inner diameter) of the cylindrical part 161 of the shaft 160; the terminals 151 to 154 which are configured to supply the electric power to the electrodes 121 to 123 are arranged in the through hole. With this, the electric power is supplied to the electrodes 121 to 123 via the terminals 151 to 154.

Note that it is allowable to provide a projected part 114 for the joining with respect to the shaft 130 (hereinafter referred to as a "joining projected part 114") (see FIG. 4). It is preferred that the shape of the joining projected part 114 is same as the shape of the upper surface of the shaft 160 to which the joining projected part 114 is joined; and that the diameter of the joining projected part 114 is not more than 100 mm. It is allowable that the height (height from the lower surface 113) of the joining projected part 114 is not less than 0.2 mm; it is preferred that the height of the joining projected part 114 is not less than 1 mm. Although there is no limitation to the upper limit of the height of the joining projected part 114, it is preferred that the height of the joining projected part 114 is not more than 20 mm, in view of the easiness in the production. Further, it is preferred that a lower surface of the joining projected part 114 is parallel to the lower surface 113 of the ceramic base member 100. It is allowable that a surface roughness Ra of the lower surface of the joining projected part 114 is not more than 1.6 μm. Note that the surface roughness Ra of the lower surface of the joining projected part 114 is preferably not more than 0.4 μm, and is more preferably not more than 0.2 μm.

An upper surface of the cylindrical part 161 is fixed to the lower surface 113 of the ceramic base member 110 (in a case that the joining projected part 114 is provided, the upper surface of the cylindrical part 161 is fixed to the lower surface of the joining projected part 114). Note that similarly to the ceramic base member 110, the shaft 160 may be formed of a ceramic sintered body such as aluminum nitride, silicon carbide, alumina, silicon nitride, etc. Alternatively, in order to enhance the heat insulating property, the shaft 160 may be formed of a material of which thermal conductivity is lower than that of the ceramic base member 110. Further, it is also allowable that a flange part 163, which is similar to the large diameter part 162 provided at the location below the cylindrical part 161, may be provided on the upper surface of the cylindrical part 161.

<Method of Producing Substrate Holder 100>

Next, an explanation will be given about a method of producing the substrate holder 100. In the following, a case that the ceramic base member 110 and the shaft 160 are formed of aluminum nitride will be explained, as an example. Note, however, that it is presumed that the conductive member 132, the connecting member 143, the electrode 122 and the land 172 are embedded in the inside of the ceramic base member 110 so that the explanation will be easily understood.

Figure 5A:
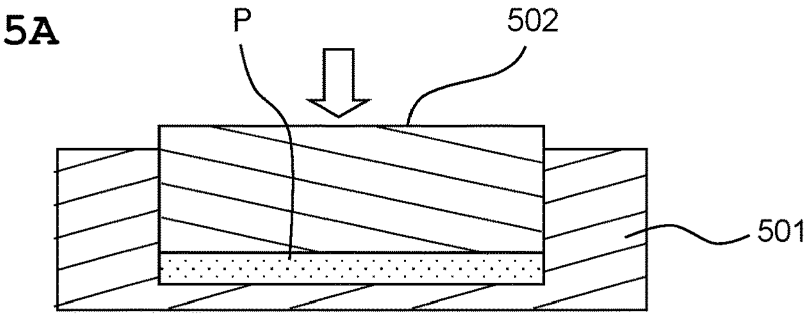
FIGS. 5A to 5E are views depicting a flow of a method of producing the ceramic base member 110.
Figure 5B:
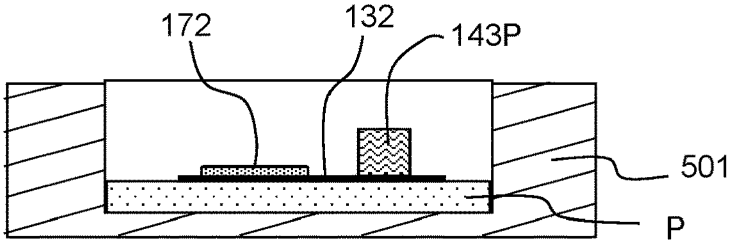

First, a method of producing the ceramic base member 110 will be explained. As depicted in FIG. 5A, granulated powder P which contains aluminum nitride (AlN) powder as a main component thereof is charged to a bottomed mold 501 made of carbon, and is subjected to a temporary pressing with a punch 502. Note that it is preferred that a not more than 5 wt % of sintering agent (for example, Y2O3) is included in the granulated powder P. Next, as depicted in FIG. 5B, the conductive member 132 which is cut to a predetermined shape is arranged on the temporarily pressed granulated powder P. Note that the conductive member 132 is arranged to be parallel to a plane orthogonal to a pressing direction (the bottom surface of the bottomed mold 501). In this situation, it is allowable to embed a pellet formed of tungsten, molybdenum, or an alloy including at least one of the molybdenum and the tungsten at a position overlapping with the terminal 153 (see FIG. 5B).

Further, as depicted in FIG. 5B, a preform 143P is arranged on the conductive member 132. The preform 143P is a porous material formed of tungsten, molybdenum, or an alloy including at least one of the molybdenum and the tungsten. Further, as depicted in FIG. 5B, the land 172 is arranged on the conductive member 132.

Figure 5C:
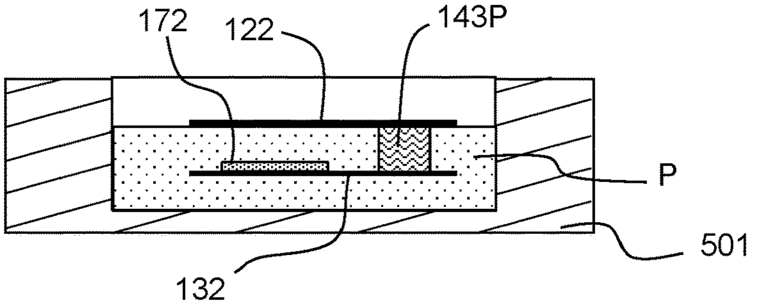

As depicted in FIG. 5C, the granulated power P is further charged to the bottomed mold 501 so as to cover the conductive member 132, the land 172 and the preform 143P, and is subjected to the temporary pressing with the punch 502 in a similar manner as described above; then, the electrode 122 is arranged on the preform 143P. In this situation, it is allowable to embed a pellet formed of tungsten, molybdenum, or an alloy including at least one of the molybdenum and the tungsten at a position overlapping with the terminal 153 (see FIG. 3B). In a case that the pellet is embedded, it is allowable to make a powder of a high melting point metal such as the tungsten, molybdenum, etc., into a paste, and to coat the paste at a location between the conductive member 132 and the pellet, and at a location between the electrode 122 and the pellet, as necessary. With this, it is possible to enhance the adhesive property between the conductive member 132 and the pellet, and between the electrode 122 and the pellet.

Figure 5D:
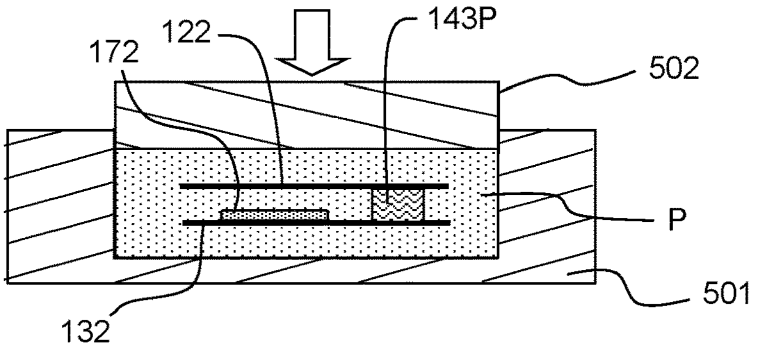
Figure 5E:
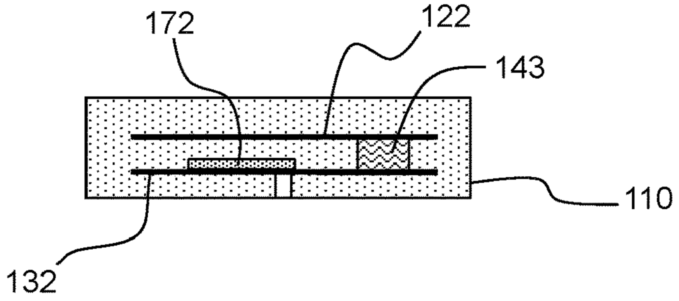

Next, as depicted in FIG. 5D, the granulated powder P is further charged to the bottomed mold 501 so as to cover the electrode 122, and is subjected to the baking in a state that the granulated power P in which the conductive member 132, the land 172, the preform 143P and the electrode 122 are embedded is pressed. It is preferred that the pressure applied during the baking is not less than 1 MPa. Further, it is preferred that the basking is performed at a temperature which is not less than 1800° C. In this situation, by performing the baking in a state that a predetermined pressure is applied to the preform 143P, the preform 143P which is porous becomes to be a fine via structure, thereby forming the connecting part 143. Note that it is not necessarily indispensable that the porous preform 143P is to be used. It is also possible to form a predetermined hole at a position at which the preform 143P is otherwise arranged, to charge a paste including tungsten or molybdenum and to perform the baking, thereby forming the via structure. Next, as depicted in FIG. 5E, a blind hole driving processing is performed up to a location of the conductive member 132 so as to form the terminal 153. Note that in a case that the pellet is embedded, it is possible to perform the blind hole driving processing up to a location of the pellet.

Figure 6A:
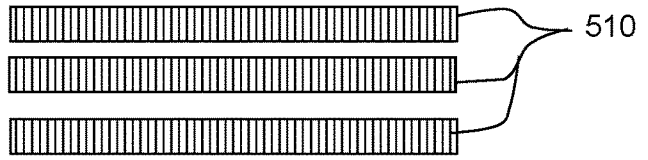
FIGS. 6A to 6E are views depicting a flow of another method of producing the ceramic base member 110.
Figure 6B:
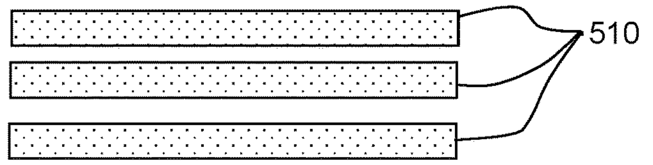

The ceramic base member 110 can be formed also by the following method. As depicted in FIG. 6A, a binder is added to the granulated powder P of the aluminum nitride so as to perform the CIP (Cold Isostatic Press) molding followed by being processed to have a disc shape, thereby producing a plurality of molded bodies (compacts) 510 of the aluminum nitride. (see FIG. 9: step S1). Next, as depicted in FIG. 6B, a degreasing processing is performed for the plurality of molded bodies 510 so as to remove the binder.

Figure 6C:
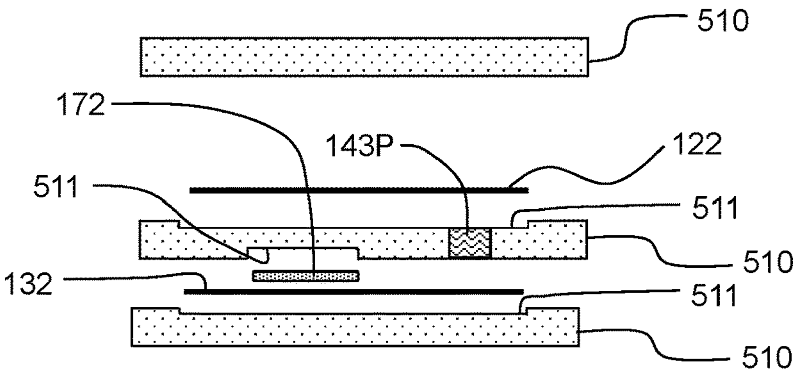
Figure 9:
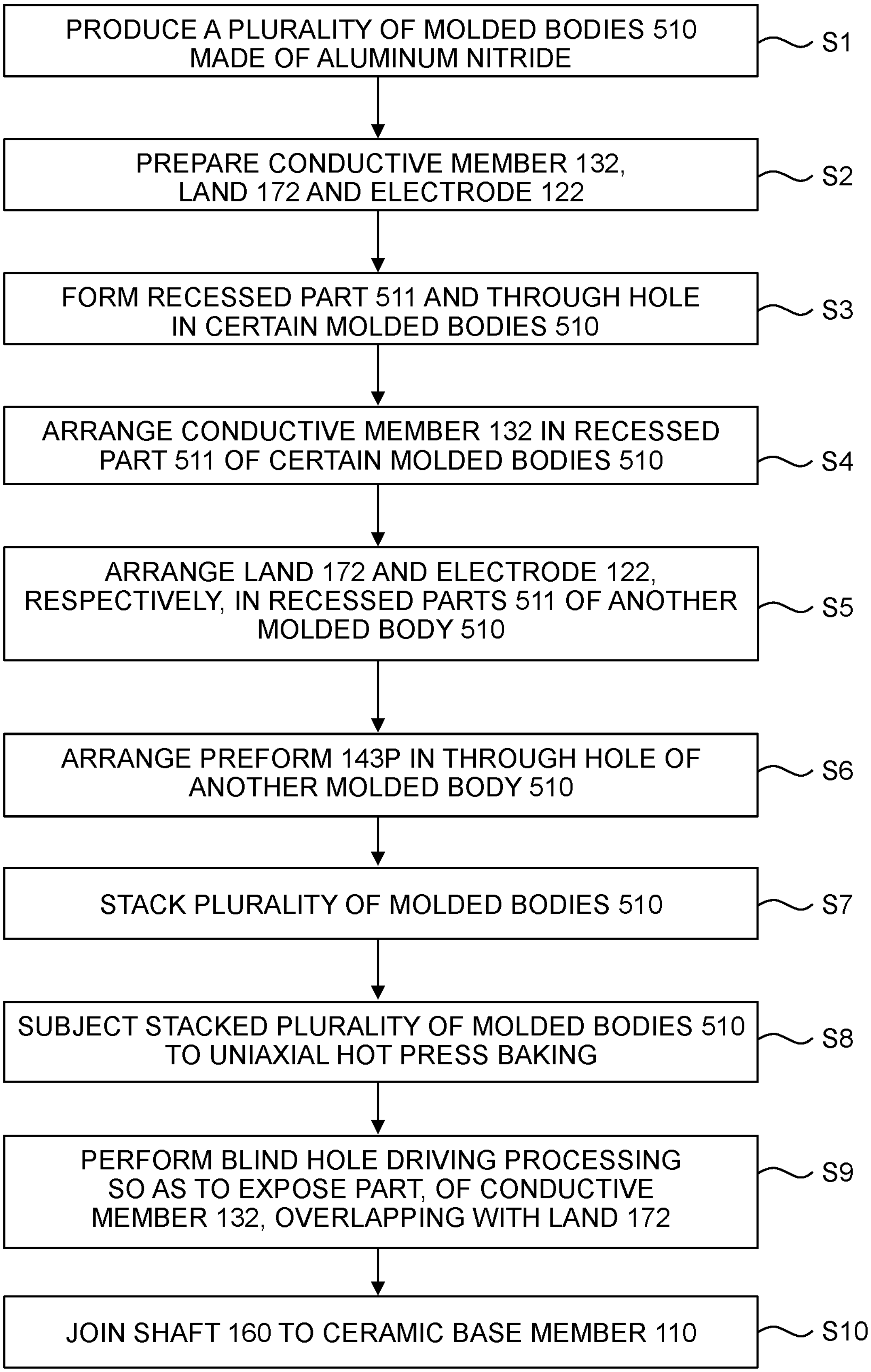
FIG. 9 is a flow chart indicating a method of producing the substrate holder 100.

The conductive member 132, the land 172 and the electrode 122 are prepared (see FIG. 9: step S2). As depicted in FIG. 6C, the recessed parts 511 for embedding the conductive member 132, the land 172 or the electrode 122 and/or a through hole for inserting the preform 143P are formed in the degreased molded bodies 510 (see FIG. 9: step S3). Note that the recessed part(s) 511 and/or the through hole may be formed in the molded bodies 510 in advance.

Figure 6D:
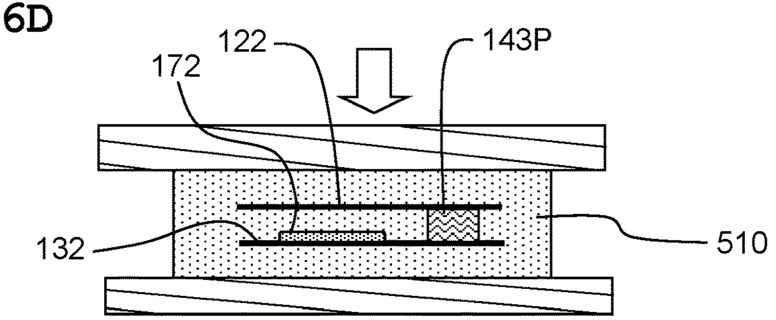
Figure 6E:
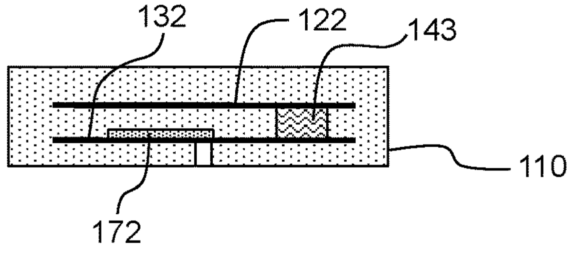

The conductive member 132 is arranged in one of the recessed parts 511 formed in one of the plurality of molded bodies 510 (see FIG. 9: step S4). Further, the land 172 and the electrode 122 are arranged, respectively, in the recessed parts 510 formed in another molded body 510 among the plurality of molded bodies 510 (see FIG. 9: step S5). Further, the preform 143P is arranged in the through hole formed in the another molded body 510 (see FIG. 9: step S6). Further, the plurality of molded bodies 510 are stacked (see FIG. 9: step S7). Note that the land 172 is arranged so that the land 172 makes contact with the conductive member 132 in a case that the plurality of molded bodies 510 are stacked. Further, it is also allowable to embed a pellet formed of tungsten, molybdenum or an alloy including at least one of the tungsten and the molybdenum at a position overlapping with the terminal 153 (see FIG. 3B). In a case that the pellet is embedded, it is also allowable to make a powder of a high melting point metal such as the tungsten, molybdenum, etc., into a paste, and to coat the paste at a location between the conductive member 132 and the pellet, and at a location between the electrode 122 and the pellet, as necessary. With this, it is possible to enhance the adhesive property between the conductive member 132 and the pellet, and between the electrode 122 and the pellet. Next, as depicted in FIG. 6D, the plurality of stacked molded bodies 510 is subjected to the baking (uniaxial hot press baking) in a state that the plurality of stacked molded bodies 510 is pressed, thereby preparing a baked body (see FIG. 9: step S8). It is possible that the pressure applied during the baking is not less than 1 MPa. Further, it is possible that the basking is performed at a temperature which is not less than 1800° C. In this situation, similarly to the above-described step, by performing the baking in a state that a predetermined pressure is applied to the preform 143P, the preform 143P which is porous becomes to be a fine via structure, thereby forming the connecting part 143. After producing the baked body, similarly to the above-described step, the blind hole driving processing is performed up to a location of the conductive member 132 (see FIG. 9: step S9). With this, it is possible to expose a part, of the conductive member 132, which overlaps with the land 172. Note that in a case that the pellet is embedded, it is possible to perform the blind hole driving processing up to a location of the pellet.

An outer shaping processing is performed with respect to the upper surface 111 of the ceramic base member 110 formed in such a manner. It is allowable to provide, on the lower surface 113 of the ceramic base member 110, the joining projected part 114 (see FIG. 4) which projects from the lower surface 113. Further, the shaft 160 is joined to the ceramic base member 110, as will be described later on (see FIG. 9: step S10).

Next, an explanation will be given about a method of producing the shaft 160 and a method of joining the shaft 160 and the ceramic base member 110. First, granulated powder P of aluminum nitride to which several wt % of a binder has been added is molded at a hydrostatic pressure (approximately 1 MPa) so as to obtain a molded body (compact), and the obtained molded body is processed to have a predetermined shape. Note that the outer diameter of the shaft 160 is in a range of approximately 30 mm to approximately 100 mm. It is allowable to provide, on an end surface of the cylindrical part 161 of the shaft 160, the flange part 163 having a diameter which is greater than the outer diameter of the cylindrical part 161 (see FIG. 4). The length of the cylindrical part 161 may be, for example, to be in a range of 50 mm to 500 mm. After the molding is processed to have the predetermined shape, the molding is baked in an atmosphere of nitrogen. For example, the molded body is subjected to the baking at a temperature of 1900° C. for two hours so as to obtain a sintered body (sintered molding). Then, by processing the sintered molding into a predetermined shape, the shaft 160 is formed. It is possible to fix the upper surface of the cylindrical part 161 and the lower surface 113 of the ceramic base member 110 by a diffusion bonding (joining) at a temperature not more than 1600° C. and under a uniaxial pressure of not less than 1 MPa. In this case, the surface roughness Ra of the lower surface 113 of the ceramic base member 110 is preferably not more than 0.4 μm, more preferably not more than 0.2 μm. Further, it is also possible to join the upper surface of the cylindrical part 161 and the lower surface 113 of the ceramic base member 110 by using a joining or bonding agent. As the joining agent, it is possible to use, for example, an AlN joining agent paste to which 10 wt % of Y2O3 has been added. For example, it is possible to join the upper surface of the cylindrical part 161 and the lower surface 113 of the ceramic base member 110 by coating the above-described AlN joining agent paste, at a thickness of 15 μm, in the interface between the upper surface of the cylindrical part 161 and the lower surface 113 of the ceramic base member 110, and by performing heating therefor at a temperature of 1700° C. for one hour while applying a force of 5 kPa in a direction perpendicular to the upper surface 111 (the longitudinal direction of the shaft 160). Alternatively, it is possible to join the upper surface of the cylindrical part 161 and the lower surface 113 of the ceramic base member 110 by screwing, blazing, etc.

<Power Supply Route of Electrodes 121 to 123>

As depicted in FIGS. 2 and 3A, the terminal 151 is connected to one end (the linear part 121*b* on the left side of FIG. 3A) of the electrode 121. The other end (the linear part 121*b* on the right side of FIG. 3A) of the electrode 121 is connected to the connecting part 141. As depicted in FIG. 3B, the connecting part 141 is connected to the conductive member 133, and further the conductive member 133 is connected to the terminal 154. With this, an electric circuit starting from the terminal 151, passing the electrode 121, the connecting part 141 and the conductive member 133 and reaching the terminal 154 is formed. By making the terminal 154 to be a ground terminal and by connecting an external power source to the terminal 151 and the terminal 154, it is possible to energize the electrode 121. Namely, the conductive member 133 is connected to the ground.

As depicted in FIG. 3B, the terminal 153 is connected to the conductive member 132, and the conductive member 132 is connected to the connecting part 143. As depicted in FIG. 3A, the connecting part 143 is connected to one end of the electrode 122, and the other end of the electrode 122 is connected to the connecting part 142. As depicted in FIG. 3B, the connecting part 142 is connected to the conductive member 133, and further the conductive member 133 is connected to the terminal 154. With this, an electric circuit starting from the terminal 153, passing the conductive member 132, the connecting part 143, the electrode 122 and the conductive member 133 and reaching the terminal 154 is formed. With this, by making the terminal 154 to be a ground terminal and by connecting the external power source to the terminal 153 and the terminal 154, it is possible to energize the electrode 122. Namely, the conductive member 133 is connected to the ground. Further, the conductive member 132 which is arranged on a plane same as the conductive member 133 is connected to the external power source.

Note that the cutout 132C which has the rectangular shape and which extends to the lower side of FIG. 3B is formed between a part, of the conductive member 132, which is connected to the terminal 153 and a part, of the conductive member 132, which is connected to the connecting part 143. By providing the cutout 132C as described above, it is possible to easily secure a space for arranging the temperature sensor TC3 in the vicinity of the terminal 153. On the other hand, the electric current is not able to linearly flow between the part, of the conductive member 132, which is connected to the terminal 153 and the part, of the conductive member 132, which is connected to the connecting part 143, and the electric current consequently flows so as to avoid (circumvent) the cutout 132C. Accordingly, in the present embodiment, a resistance value between the part, of the conductive member 132, which is connected to the terminal 153 and the part, of the conductive member 132, which is connected to the connecting part 143 becomes higher than that in a case wherein the cutout 132C is not provided. In view of this, in the present embodiment, the land 172 is arranged on the conductive member 132 to as to avoid the cutout 132C. As described above, the electric current is capable of flowing, while passing through the land 172, between the part, of the conductive member 132, which is connected to the terminal 153 and the part, of the conductive member 132, which is connected to the connecting part 143. With this, it is possible to lower the resistance value between the part, of the conductive member 132, which is connected to the terminal 153 and the part, of the conductive member 132, which is connected to the connecting part 143, as compared with that in a case wherein the land 172 is not provided.

As depicted in FIG. 3B, the terminal 152 is connected to one end of the land 171, and the other end of the land 171 is connected to the conductive member 131. The conductive member 131 is connected to the connecting part 144. Further, the connecting part 144 is connected to one end of the electrode 123, and the other end of the electrode 123 is connected to the connecting part 145. The connecting part 145 is connected to the conductive member 133, and further the connecting member 133 is connected to the terminal 154. With this, an electric circuit starting from the terminal 152, passing the land 171, the connective member 131, the connecting part 144, the electrode 123, the connecting part 145 and the conductive member 133 and reaching the terminal 154 is formed. By making the terminal 154 to be the ground terminal and by connecting the external power source to the terminal 153 and the terminal 154, it is possible to energize the electrode 123. Namely, the conductive member 133 is connected to the ground. Further, the conductive member 131 which is arranged on a plane same as the conductive member 133 is connected to the external power source.

<Technical Effect of Embodiment>

In the present embodiment, the substrate holder 100 is provided with the ceramic base member 110, the electrodes 121 to 123, the conductive members 131 to 133, the connecting parts 141 to 145, the terminals 151 to 154 and the lands 171 and 172. The electrodes 121 to 123, the conductive members 131 to 133, the connecting parts 141 to 145 and the lands 171 and 172 are embedded in the ceramic base member 110. Further, the connecting part 141 connects the electrode 121 and the conductive member 133, the connecting part 142 connects the electrode 122 and the conductive member 133, and the connecting part 145 connects the electrode 123 and the conductive member 133. The connecting part 143 connects the electrode 122 and the conductive member 132. The connecting part 144 connects the electrode 123 and the conductive member 131. The terminal 151 is connected to the electrode 121, the terminal 152 is connected to the land 171, the terminal 153 is connected to the conductive member 132, and the terminal 154 is connected to the conductive member 133. The land 171 overlaps with the terminal 152 in the up-down direction, at a first position (a right end of the land 171 in the present embodiment), and the land 171 overlaps with the conductive member 131 in the up-down direction, at a second position which is different from the first position (a left end of the land 171 in the present embodiment). In this situation, the land 171 is capable of electrically connecting the terminal 152 and the conductive member 131.

By connecting two terminals, respectively, to the both ends of each of the electrodes, it is possible to energize each of the electrodes from the external power source via the two terminals. In this case, however, the terminals of which number (quantity) is two times the number of the electrodes are required. In contrast, in the above-described embodiment, the connecting part 141 connected to the electrode 121, the connecting part 142 connected to the electrode 122 and the connecting part 145 connected to the electrode 123 are connected to the conductive member 133. Further, the terminal 154 is connected to the conductive member 133. Accordingly, the plurality of electrodes 121 to 123 is connected to the one terminal 154 via the one conductive member 133. Owing to such a configuration, the number (4 (four)) of the terminals 154 to 155 can be made smaller than two times the number (3 (three)) of the electrodes 121 to 123. Further this, the space for arranging the plurality of terminals therein can be made small. Further, since the electrode and the terminal can be connected via the conductive member, the land and/or the connecting part, it is possible to made the degree of the freedom of arranging the terminals to be high, as compared with a case that the electrode and the terminal are connected not via the conductive member, the land and/or the connecting part. For example, it is possible to gather the terminals 151 to 154 to a location in the vicinity of the center of the lower surface 113 of the ceramic base member 110 so that all the terminals 151 to 154 pass through the through hole of the shaft 160, as in the present embodiment.

In the present embodiment, the resistance value between the connecting part 144 and the part, of the land 171, which is connected to the terminal 152 is smaller than the resistance value of any one of the electrodes 121 to 123. The resistance value between the connecting part 143 and the part, of the conductive member 132, which is connected to the terminal 153 is smaller than the resistance value of any one of the electrodes 121 to 123. The resistance value between the connecting part 141 and the part, of the conductive member 133, which is connected to the terminal 154 is smaller than the resistance value of any one of the electrodes 121 to 123. Similarly, the resistance value between the connecting part 142 and the part, of the conductive member 133, which is connected to the terminal 154 and the resistance value between the connecting part 145 and the part, of the conductive member 133, which is connected to the terminal 154 are each smaller than the resistance value of any one of the electrodes 121 to 123. With this, even in a case that the electrode and the terminal are not directly connected, it is possible to suppress, as much as possible, the generation of heat between the electrode and the terminal.

The land 172 extends from a first position (an upper end of the land 172 in the present embodiment) up to a second position (a right end of the land 172 in the present embodiment) which is different from the first position, in a shape of a letter "L". The land 172 overlaps with the terminal 153 in the up-down direction, at the first position. As described above, the land 172 is capable of forming a division or detour route in the conductive member 132 for the electric current flowing from the first position to the second position. Namely, in a case that the land 172 is not formed, the electric current is capable of flowing from the first position to the second position while passing the conductive member 132. In a case that the land 172 is formed on the conductive member 132, the electric current is capable of flowing from the first position up to the second position while passing the conductive member 132 and also is capable of flowing from the first position up to the second position while passing the land 172. Accordingly, it is possible to make the resistance value at the location from the first position up to the second position be small. Further, the thickness of the land 172 is great, as compared with the thickness of the conductive member 132. This also contributes to the lowering of the resistance value from the first position up to the second position. In such a manner, in the present embodiment, the lands 171 and 172 are provided to thereby make the resistance in the parts in each of which one of the lands 171 and 172 is provided, thereby making it possible to suppress the generation of the heat particularly in the parts in each of which one of the lands 171 and 172 is provided.

In the present embodiment, the ceramic base member 110 includes the aluminum nitride. Further, the lands 171 and 172 are each formed of the high melting point metal of which melting point is not less than 2000° C. The difference in the average coefficient of linear expansion between the aluminum nitride and the high melting point metal such as tungsten and molybdenum, etc., is small. Accordingly, in a case of embedding the lands 171 and 172 in the ceramic base member 110 made of the aluminum nitride and performing the baking therefor, it is possible to suppress the generation of crack, etc.

In the embodiment, the cutout 131C is provided on the conductive member 131, and the terminal 151 extends upward, while passing the area in which the cutout 131C is provided, so as not to make contact with the conductive member 131. With this, it is possible to arrange the terminal at a position overlapping with the conductive member which is not electrically connected to the terminal, thereby making it possible to enhance the degree of the freedom of arranging the terminal. Further, in a case that the terminal and the electrode are connected, not via the connecting member embedded in the inside of the ceramic base member 110, it is possible to reduce the risk of any connection failure in the inside of the ceramic base member 110. Note that the temperature sensors TC1 and TC2 such as thermocouples, etc., are provided on the area on which the cutout 131C is provided, respectively, at the locations in the vicinity of the terminals 151 and 152. Further, the cutout 132C is provided on the conductive member 132, and the temperature sensor TC3 such as a thermocouple, etc., is similarly provided on the area on which the cutout 132C is provided, at the location in the vicinity of the terminal 153. In such a manner, by forming the cutout in the conductive member, it is possible to easily secure the space for arranging the temperature sensor. Note that, however, by providing the cutout in the conductive member, there arises a case that the resistance value between the terminal and the connecting part becomes great. In the present embodiment, since the land is arranged so as to avoid the cutout, it is possible to suppress any increase in the resistance value between the terminal and the connecting part.

In the embodiment, the cylindrical or tubular shaped shaft 160 is provided on the lower surface 113 of the ceramic base member 110. Further, the terminals 151 to 154 are arranged on the inner side with respect to the outer diameter of the shaft 160. In this case, by hermetically sealing the inner side and the outer side of the cylindrical shaped shaft 160, it is possible to protect the terminals 151 to 154 from the external environment of the shaft 160. Furthermore, by providing the cylindrically shaped shaft 160, it is possible to prevent the ceramic base member 110 from directly making contact with an external apparatus, etc. With this, it is possible to thermally insulate the ceramic base member 110 from the surrounding thereof, and to enhance the thermal uniformity (soaking property) of the ceramic base member 110.

In the embodiment, the conductive members 131 to 133 and the electrodes 121 to 123 are formed of the same material (the foil including tungsten (W), molybdenum (Mo) or an alloy including the molybdenum and/or the tungsten, or the mesh which is obtained by weaving a wire including tungsten (W), molybdenum (Mo) or an alloy including the molybdenum and/or the tungsten). With this, it is possible to easily produce the substrate holder 100. In the embodiment, the connecting parts 141 to 143 are each the via structure connecting the virtual plane A and the virtual plane B. Further, the connecting parts 144 and 145 are each formed of the same material as that of the electrodes 121 to 123 and the conductive members 131 to 133 (the foil including tungsten (W), molybdenum (Mo) or an alloy including the molybdenum and/or the tungsten, or the mesh which is obtained by weaving a wire including tungsten (W), molybdenum (Mo) or an alloy including the molybdenum and/or the tungsten). Furthermore, the connecting part 144 is integrally formed with the conductive member 131 and the electrode 123, and the connecting part 145 is integrally formed with the conductive member 133 and the electrode 123. With this, it is possible to connect the connecting part to the electrode and/or the conductive member in an ensured manner, thereby making it possible to reduce the risk of any connection failure. Note that the material of the electrodes 121 to 123 may be different from the material of the conductive members 131 to 133. In such a case, it is possible to increase the degree of freedom of the selection of the material forming the electrodes 121 to 123 and of the material forming the conductive members 131 to 133. For example, the electrodes 121 to 123 may be formed of the mesh which is obtained by weaving a wire including tungsten (W), molybdenum (Mo) or an alloy including the molybdenum and/or the tungsten, in order to make the area thereof to be small with a material of which sheet resistance and volume resistivity are great to thereby increase the resistance value and to make the heat value (calorific power) to be great. Further, the conductive members 131 to 133 may be formed of the foil including tungsten (W), molybdenum (Mo) or an alloy including the molybdenum and/or the tungsten, in order to make the area thereof to be great with a material of which sheet resistance and volume resistivity are small to thereby lower the resistance value and to suppress the heat value.

<Modifications>

The embodiment as described above is merely an example, and may be changed as appropriate. For example, the shape and the size of each of the ceramic base member 110 and the shaft 160 are not limited to or restricted by those of the above-described embodiment, and may be changed as appropriate. Further, the shape, the size, the number (quantity), etc., of each of the electrode, the conductive member, the connecting part, the terminal and the land embedded in the ceramic base member 110 may be changed as appropriate. Furthermore, the shape, the size, etc., of the cutout formed in the conductive member may also be changed as appropriate. Moreover, it is also allowable to form an opening in the conductive member, instead of forming the cutout.

In the embodiment, the molybdenum, the tungsten or an alloy including the molybdenum and/or the tungsten is used as the material forming the electrodes 121 to 123. The present disclosure, however, is not limited to such an aspect. For example, it is allowable to use a metal or an alloy different from the molybdenum and the tungsten.

In the embodiment, although the base holder 100 is provided with the three electrodes 121 to 123 embedded in the ceramic base member 110, the present disclosure is not limited to such an aspect; the number of the electrode embedded in the ceramic base member 110 of the substrate holder 100 may be 2 (two) or not less than 4 (four). For example, as depicted in FIGS. 7, 8A and 8B, four electrodes 221 to 224 may be embedded in a ceramic base member 210.

Figure 7:
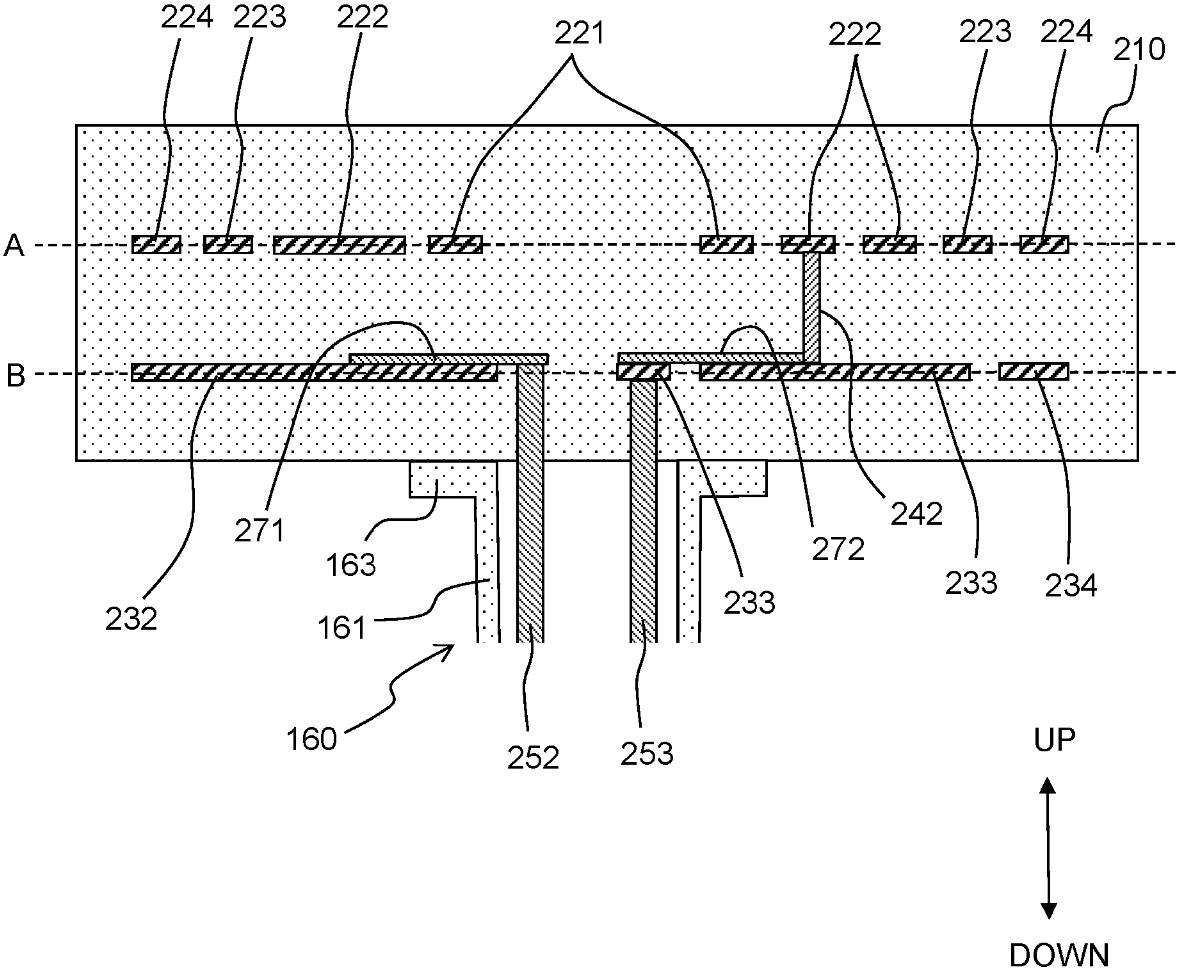
FIG. 7 is a view of a ceramic base member 210 in which four electrodes 221 to 224 are embedded, corresponding to FIG. 2.
Figure 8A:
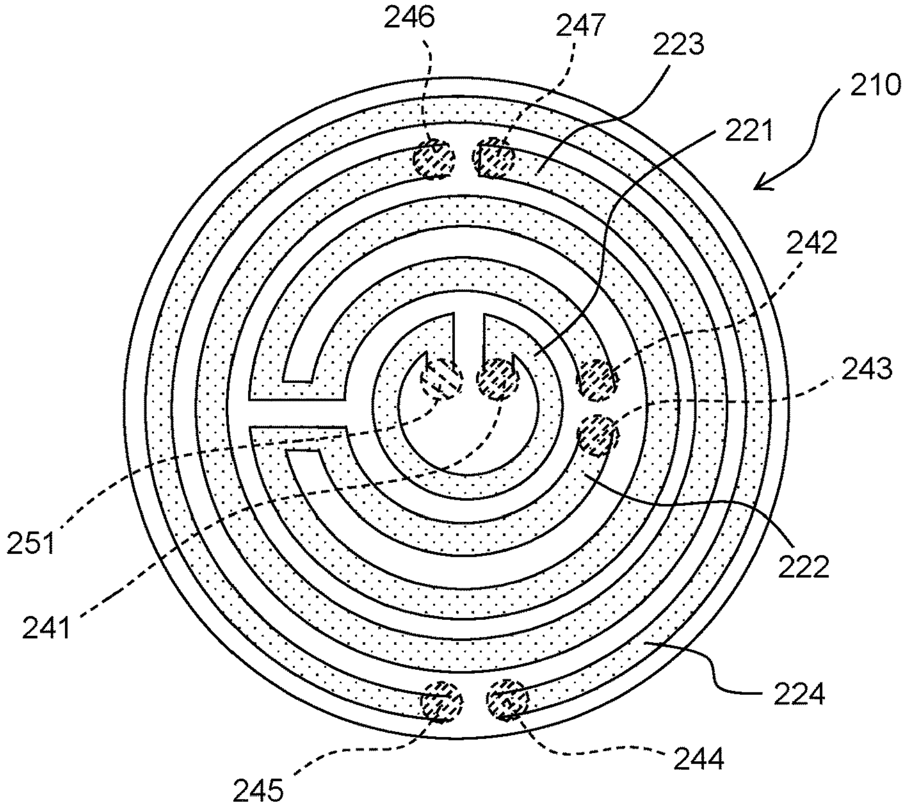
FIG. 8A is a view of the ceramic base member 210 in which the four electrodes 221 to 224 are embedded, corresponding to FIG. 3A.
Figure 8B:
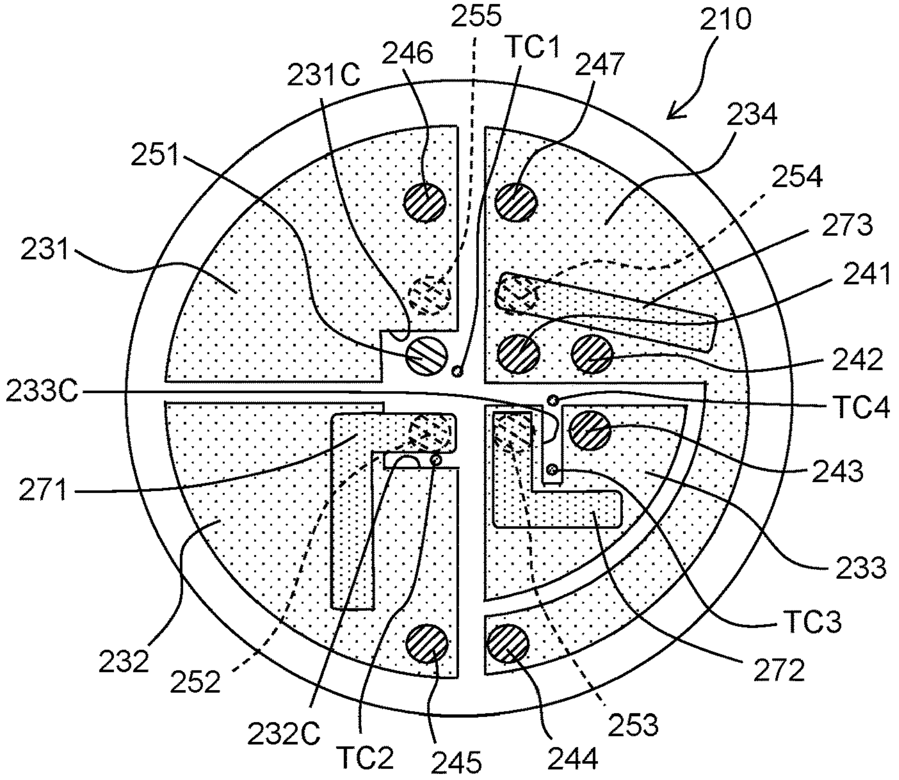
FIG. 8B is a view of the ceramic base member 210 in which the four electrodes 221 to 224 are embedded, corresponding to FIG. 3B.

As depicted in FIGS. 7, 8A and 8B, the four electrodes 221 to 224 are embedded in a virtual plane A of the ceramic base member 210, and four conductive members 231 to 234 and three lands 271 to 273 are arranged in a virtual plane B of the ceramic base member 210. Further, five terminals 251 to 255 are provided on the ceramic base member 210, and passages TC1 to TC4 via each of which a temperature sensor, etc., is arranged, are provided, respectively, on the vicinities of the terminals 251 to 254. Since the material of the electrodes 221 to 224 is same as that of the above-described electrodes 121 to 123, the material of the conductive members 231 to 234 is same as that of the above-described conductive members 151 to 153, the material of the lands 271 to 273 is same as that of the above-described lands 171 and 172, and the material of the terminals 251 to 255 are same as that of the above-described terminals 151 to 154, any explanation therefor will be omitted.

As depicted in FIGS. 7 and 8A, the terminal 251 is connected to one end of the electrode 221. The other end of the electrode 221 is connected to the connecting part 241. As depicted in FIG. 8B, the connecting part 241 is connected to the conductive member 234, and further the conductive member 234 is connected to the terminal 254. With this, an electric circuit starting from the terminal 251, passing the electrode 221, the connecting part 241 and the conductive member 234 and reaching the terminal 254 is formed. By making the terminal 254 to be a ground terminal and by connecting an external power source to the terminal 251 and the terminal 254, it is possible to energize the electrode 221.

As depicted in FIG. 8B, the terminal 253 is connected to the conductive member 233, and further the conductive member 233 is connected to the connecting part 243. A cutout 233C is provided on the conductive member 233, and a land 272 which has a shape of letter "L" and which is similar to the land 172 is provided so as to avoid the cutout 233C. The connecting part 243 is connected to one end of the electrode 222. The other end of the electrode 222 is connected to the connecting part 242. As depicted in FIG. 8B, the connecting part 242 is connected to the conductive member 234, and further the conductive member 234 is connected to the terminal 254. With this, an electric circuit starting from the terminal 253, passing the conductive member 233, the connecting part 243, the electrode 222, the connecting part 242 and the conductive member 234 and reaching the terminal 254 is formed. With this, by making the terminal 254 to be a ground terminal and by connecting the external power source to the terminal 253 and the terminal 254, it is possible to energize the electrode 222. Note that the land 272 is provided on the conductive member 233. Accordingly, the electric current is capable of flowing through the land 172 between a part, of the conductive member 233, which is connected to the terminal 253 and a part, of the conductive member 233, which is connected to the connecting part 243. With this, it is possible to lower the resistance value between the part, of the conductive member 233, which is connected to the terminal 253 and the part, of the conductive member 233, which is connected to the connecting part 243, as compared with that in a case wherein the land 272 is not provided, thereby making it possible to suppress the generation of the heat in this part.

As depicted in FIG. 8B, the terminal 255 is connected to the conductive member 231, and further the conductive member 231 is connected to the connecting part 246. The connecting part 246 is connected to one end of the electrode 223. The other end of the electrode 223 is connected to the connecting part 247. As depicted in FIG. 8B, the connecting part 247 is connected to the conductive member 234, and further the conductive member 234 is connected to the terminal 254. With this, an electric circuit starting from the terminal 255, passing the conductive member 231, the connecting part 246, the electrode 223, the connecting part 247 and the conductive member 234 and reaching the terminal 254 is formed. With this, by making the terminal 254 to be the ground terminal and by connecting the external power source to the terminal 255 and the terminal 254, it is possible to energize the electrode 223.

As depicted in FIG. 8B, the terminal 252 is connected to the land 271, the land 271 is connected to the conductive member 232, and further the conductive member 232 is connected to the connecting part 245. The connecting part 245 is connected to one end of the electrode 224. The other end of the electrode 224 is connected to the connecting part 244. As depicted in FIG. 8B, the connecting part 244 is connected to the conductive member 234, and further the conductive member 234 is connected to the terminal 254. With this, an electric circuit starting from the terminal 252, passing the conductive member 232, the connecting part 245, the electrode 224, the connecting part 244 and the conductive member 234 and reaching the terminal 254 is formed. By making the terminal 254 to be the ground terminal and by connecting the external power source to the terminal 252 and the terminal 254, it is possible to energize the electrode 224. Note that, as depicted in FIG. 8B, the land 271 extends on the conductive member 232 up to a location in the vicinity of the connecting part 245. With this, it is possible to lower the resistance value at the location from the terminal 252 up to the connecting part 245, as compared with a case that the land 272 does not extends up to the location in the vicinity of the connecting part 245, thereby making it possible to suppress the generation of heat at the location from the terminal 252 and up to the connecting part 245.

As described above, also in a case that the four electrodes 221 to 224 are embedded in the ceramic base member 110, it is possible to achieve the effect similar to that achieved by the above-described substrate holder 100.

In the above-described embodiment, although the substrate holder 100 is provided with the shaft 160, the present disclosure is not limited to such an aspect; it is not necessarily indispensable that the substrate holder 100 is provided with the shaft 160.

Figure 10A:
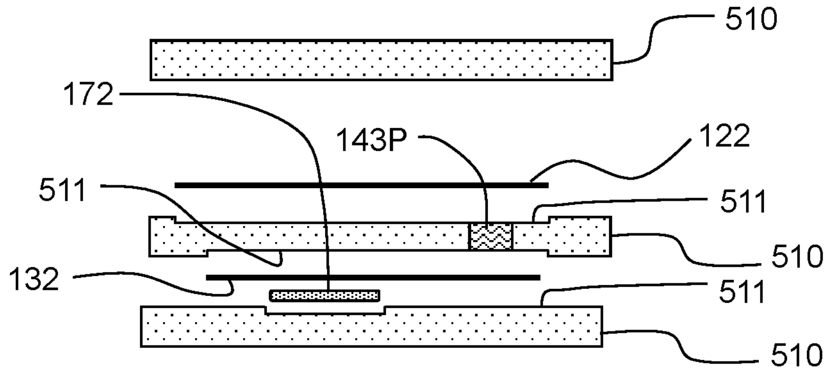
FIG. 10A is a view of the ceramic base member 110, corresponding to FIG. 6C.
Figure 10B:
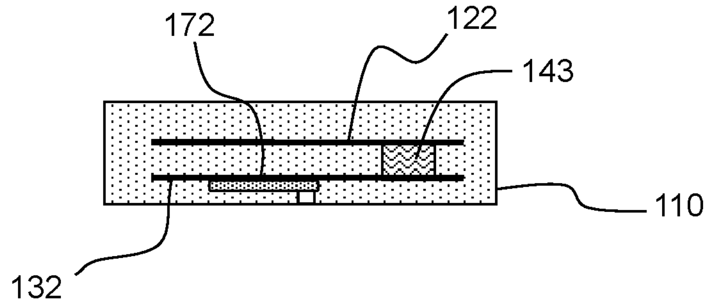
FIG. 10B is a view of the ceramic base member 110, corresponding to FIG. 6E.

In the embodiment, although the land is arranged on the conductive member, the present disclosure is not limited to such an aspect; it is allowable that the land is arranged at a location below the conductive member. A substrate holder 100 in which the land is arranged at the location below the land can be produced, for example, by the following manner. Note that any explanation regarding a step which is same as that in the method of producing the substrate holder 100 of the above-described embodiment will be omitted, and only a step different from that in method of producing the substrate holder 100 of the above-described embodiment will be explained. In the method of producing the substrate holder 100 of the above-described embodiment, in FIG. 6C, the conductive member 132 is arranged in the recessed part 511 of the lower (lowermost) molding 510, and the land 172 is arranged in the recessed part 511 in the lower surface of the middle molding 510. Instead of this, as depicted in FIG. 10A, the land 172 is arranged in a recessed part 511 of a lower molding 510, and the conductive member 132 is arranged in a recessed part 511 of a lower surface of a middle molding 510. Afterward, similarly to the method of producing as described above, the uniaxial hot press baking is performed, and then the blind hole driving processing is performed up to a location of the land 172 so as to form the terminal 153 (see FIG. 10B). With this, it is possible to expose the land 172. Further, it is allowable to arrange, in the lower molding 510, the land 172 and the conductive member 132 so that the land 172 and the conductive member 132 are overlapped with each other. In such a case, it is allowable to provide a two-stage recessed part at a position, in the lower molding 510, at which both of the land 172 and the conductive member 132 are arranged. Note that in the step depicted in FIG. 10A, it is allowable to embed a pellet, which is formed of the tungsten, the molybdenum or an alloy including at least one of the molybdenum and the tungsten, at a position which is below the land 172 and which overlaps with the terminal 153 (see FIG. 3B). In a case that the pellet is embedded, it is allowable to perform the blind hole driving processing up to a location of the pellet.

In the foregoing, although the explanation has been given by using the embodiment and the modifications thereof of the present disclosure, the technical scope of the present disclosure is not limited to the scope or range of the above-described description. It is apparent to a person skilled in the art that various changes or improvement can be made to the above-described embodiment and the modifications thereof. It is apparent, also from the description of the claims, to the person skilled in the art that an aspect obtained by adding such a change or improvement is also included in the technical scope of the present disclosure.

The order of executing of the respective processings in the production method indicated in the specification and in the drawings can be executed in an arbitrary order, unless the order is clearly described, and/or unless the output of a preceding processing is used in a succeeding processing. Even in a case that the explanation is given by using, for the sake of convenience, the terms such as “at first”, “first”, “next”, “then”, etc., it is not meant that it is necessarily indispensable that the respective processings are executed in this order.

The present disclosure can be realized also as the aspects as follows:

First Example of Application

A substrate holder including: a ceramic base member having an upper surface and a lower surface facing the upper surface in an up-down direction; a plurality of electrodes embedded in the ceramic base member; at least one conductive member embedded in the ceramic base member; a plurality of connecting parts each of which has an end electrically connected to one of the plurality of electrodes; a land electrically connected to the at least one conductive member; and a plurality of terminals each of which has an end connected to one of the land, the at least one conductive member or one of the plurality of electrodes. A resistance value between a connecting part, of the plurality of connecting parts, connected to the at least one conductive member, and a terminal, of the plurality of terminals, connected to the at least one conductive member is smaller than a resistance value between both ends of each of the plurality of electrodes. The number of the plurality of terminals is smaller than two times the number of the plurality of electrodes. The land overlaps with one of the plurality of terminals in the up-down direction, at a first position in a horizontal plane which is orthogonal to the up-down direction. The land overlaps, at a second position different from the first position in the horizontal plane, with one of the plurality of connecting parts and one of the plurality of electrodes in the up-down direction, or overlaps, at the second position, with the at least one conductive member in the up-down direction.

Second Example of Application

The substrate holder according to First Example of Application, wherein the plurality of electrodes and at least a part of the at least one conductive member are a mesh of a wire of at least one kind of metal selected from the group consisting of: tungsten, molybdenum and an alloy including the molybdenum and/or the tungsten.

Third Example of Application

The substrate holder according to First or Second Example of Application, wherein a thickness of each of the plurality of electrodes and a thickness of the at least one conductive member are in a range of 0.03 mm to 0.2 mm, except for an intersection point of the wire.

Fourth Example of Application

The substrate holder according to any one of First to Third Examples of Application, wherein the ceramic base member includes aluminum nitride; and the land includes a metal of which melting point is not less than 2000° C.

Fifth Example of Application

The substrate holder according to any one of First to Fourth Examples of Application, further including a tubular shaft joined to the lower surface of the ceramic base member. The plurality of terminals is arranged on an inner side with respect to an outer diameter of the shaft.

Sixth Example of Application

A method of producing a substrate holder, the method including: preparing a plurality of ceramic molded bodies each of which has a shape of a flat plate and each of which includes, as a component thereof, aluminum nitride; preparing a plurality of electrodes, at least one conductive member and a land; arranging the plurality of electrodes on one surface of a ceramic molded body in the plurality of ceramic molded bodies, and arranging one conductive member in the at least one conductive member on the other surface of the ceramic molded body or on one surface of another ceramic molded body in the plurality of ceramic molded bodies; arranging a connecting part between each of the plurality of electrodes and the at least one conductive member; arranging the land so that the land makes contact with the at least one conductive member; forming a stacked body by stacking the ceramic molded body, the another ceramic molded body and yet another ceramic molded body in the plurality of ceramic molded bodies so that the plurality of electrodes, the at least one conductive member and the land are embedded in the another ceramic molded body and the yet another ceramic molded body; performing an uniaxial hot press baking for the stacked body; and exposing the land from the burnt stacked body, or exposing, from the burnt stacked body, a part, of the at least one conductive member, which overlaps with the land in an up-down direction.

Seventh Example of Application

The method of producing the substrate holder according to Sixth Example of Application, further including joining a ceramic shaft having a tubular shape and including aluminum nitride to a lower surface of the stacked body in which the plurality of terminals, the land or the part, of the at least one conductive member, which overlaps with the land in the up-down direction is exposed.

What is claimed is:

1. A substrate holder comprising:

a ceramic base member having an upper surface and a lower surface facing the upper surface in an up-down direction;

a plurality of electrodes embedded in the ceramic base member;

at least one conductive member embedded in the ceramic base member;

a plurality of connecting parts each of which has an end electrically connected to one of the plurality of electrodes;

a land electrically connected to the at least one conductive member; and a plurality of terminals each of which has an end connected to one of the land, the at least one conductive member or one of the plurality of electrodes, wherein a resistance value between a connecting part, of the plurality of connecting parts, connected to the at least one conductive member, and a terminal, of the plurality of terminals, connected to the at least one conductive member is smaller than a resistance value between both ends of each of the plurality of electrodes, the number of the plurality of terminals is smaller than two times the number of the plurality of electrodes, the land overlaps with one of the plurality of terminals in the up-down direction, at a first position in a horizontal plane which is orthogonal to the up-down direction, the land overlaps, at a second position different from the first position in the horizontal plane, with one of the plurality of connecting parts and one of the plurality of electrodes in the up-down direction, or overlaps, at the second position, with the at least one conductive member in the up-down direction, the at least one conductive member includes a cutout, an end of at least one of the plurality of terminals is connected to an end of one of the plurality of electrodes without the at least one conductive member and at a position overlapping the cutout in the up-down direction, and the at least one of the plurality of terminals passes through an area in which the cutout is formed so as not to be electrically connected to the at least one conductive member.

2. The substrate holder according to claim 1, wherein the plurality of electrodes and at least a part of the at least one conductive member are a mesh of a wire of at least one kind of metal selected from the group consisting of: tungsten, molybdenum and an alloy including the molybdenum and/or the tungsten.

3. The substrate holder according to claim 2, wherein a thickness of the wire of the mesh of each of the plurality of electrodes and the at least a part of the at least one conductive member are in a range of 0.03 mm to 0.2 mm.

4. The substrate holder according to claim 1, wherein the ceramic base member includes aluminum nitride, and the land includes a metal of which melting point is not less than 2000° C.

5. The substrate holder according to claim 1, further comprising a tubular shaft joined to the lower surface of the ceramic base member, wherein the plurality of terminals is arranged on an inner side with respect to an outer diameter of the shaft.

6. A method of producing a substrate holder, the method comprising:

preparing a plurality of ceramic molded bodies each of which has a shape of a flat plate and each of which includes, as a component thereof, aluminum nitride;

preparing a plurality of electrodes, at least one conductive member and a land;

forming a cutout in one conductive member of the at least one conductive member at a position overlapping one electrode of the plurality of electrodes in an up-down direction;

arranging the plurality of electrodes on one surface of a ceramic molded body in the plurality of ceramic molded bodies, and arranging the one conductive member in the at least one conductive member on the other surface of the ceramic molded body or on one surface of another ceramic molded body in the plurality of ceramic molded bodies;

arranging a connecting part between each of the plurality of electrodes and the at least one conductive member;

arranging the land so that the land makes contact with the at least one conductive member;

forming a stacked body by stacking the ceramic molded body, the another ceramic molded body and yet another ceramic molded body in the plurality of ceramic molded bodies so that the plurality of electrodes, the at least one conductive member and the land are embedded in the another ceramic molded body and the yet another ceramic molded body;

performing an uniaxial hot press baking for the stacked body;

exposing the land from the burnt stacked body, or exposing, from the burnt stacked body, a part, of the at least one conductive member, which overlaps with the land in an up-down direction, exposing one of the plurality of electrodes from the burnt stacked body via the cutout formed in the one conductive member, forming a hole through the cutout formed in the one conductive member so as to expose the one electrode from the burnt stacked body via the cutout, and arranging a terminal in the hole so that the terminal is connected to the one electrode and is not electrically connected to the one conductive member.

7. The method of producing the substrate holder according to claim 6, further comprising joining a ceramic shaft having a tubular shape and including aluminum nitride to a lower surface of the stacked body in which the plurality of terminals, the land or the part, of the at least one conductive member, which overlaps with the land in the up-down direction is exposed.

* * * * *